United States Patent

Herden et al.

[11] Patent Number: 5,109,829
[45] Date of Patent: May 5, 1992

[54] HIGH VOLTAGE SWITCH

[75] Inventors: Werner Herden, Gerlingen; Johann Konrad, Tamm; Helmut Sautter, Ditzingen; Wadym Suchowerskyj, Leonberg, all of Fed. Rep. of Germany

[73] Assignee: Robert Bosch GmbH, Stuttgart, Fed. Rep. of Germany

[21] Appl. No.: 457,759

[22] PCT Filed: Jun. 22, 1988

[86] PCT No.: PCT/DE88/00371
§ 371 Date: Dec. 20, 1989
§ 102(e) Date: Dec. 20, 1989

[87] PCT Pub. No.: WO89/00645
PCT Pub. Date: Jan. 26, 1989

[30] Foreign Application Priority Data

Jul. 9, 1987 [DE] Fed. Rep. of Germany ....... 3722666

[51] Int. Cl.$^5$ .............................................. F02P 7/02
[52] U.S. Cl. ........................... 123/643; 123/146.50 A; 123/613; 307/311
[58] Field of Search ................ 123/146.5 A, 643, 613, 123/655; 307/311

[56] References Cited

U.S. PATENT DOCUMENTS

| 3,428,033 | 2/1969 | Watts | 123/146.5 A |
| 3,438,362 | 4/1969 | Clyborne et al. | 123/146.5 A |
| 3,459,943 | 8/1969 | Harnden, Jr. | 307/311 X |
| 3,463,134 | 8/1969 | Zechnall et al. | 123/146.5 A |
| 3,524,986 | 8/1970 | Harnden, Jr. | 307/311 X |
| 4,570,079 | 2/1986 | Davis | 307/311 |

FOREIGN PATENT DOCUMENTS 3731412  5/1988  Fed. Rep. of Germany ...... 123/643

*Primary Examiner*—Tony M. Argenbright
*Attorney, Agent, or Firm*—Michael J. Striker

[57] ABSTRACT

A high-voltage switch (10), which is usable particularly as an ignition voltage distributor for applying the ignition voltage to spark plugs of an internal combustion engine, comprises a cascade circuit of optoelectronic semiconductor elements (11) which are actuated by means of incident light radiation. A plurality of photo semiconductor elements (11) are controlled by a light-emitting element (12) via a biconvex cylinder lens (30). A distribution of the radiation by means of light guide fibers (37) is also possible. The light-emitting elements (12) which are operated with low voltage can be arranged in a housing (36) separate from the high-voltage side by means of the use of light guides (37), so that a complete galvanic separation is achieved.

11 Claims, 3 Drawing Sheets

HIGH VOLTAGE SWITCH

BACKGROUND OF THE INVENTION

The invention is based on a high-voltage switch for use as an ignition voltage distributor for applying the ignition voltage to spark plug of an internal combustion engine. Ignition distributor arrangements are known which are constructed as so-called static high-voltage distributors and have no moving parts. These known arrangements use semiconductor elements for every spark plug to be controlled, an ignition coil being assigned to these semiconductor elements in each instance. These circuits are relatively costly and particularly expensive to produce because of the plurality of necessary ignition coils.

In addition, it is known in a high-voltage switch to control every semiconductor element by means of its own diode. In so doing, a large quantity of components are necessary, making this high-voltage distributor relatively expensive to build.

SUMMARY OF THE INVENTION

An object to the invention is to provide a high-voltage switch of the above described type in which, has the advantage that only one ignition coil and only one ignition output stage is required for all spark plugs. According to the invention, a plurality of optoelectronic semiconductor elements are connected to high voltage; at least one light-emitting element is provided per each spark plug; every light-emitting element is in a working connection with a plurality of the semiconductor elements; and at least one biconvex cylinder lens is arranged between the light-emitting elements and the semiconductor elements. The semiconductor elements, which are in a cascade arrangement and are preferably constructed as high-voltage phototransistors or photothyristors or photo-IC's, are actuated by means of incident light radiation, i.e. the semiconductor elements connect through when illuminated and accordingly apply the ignition pulses supplied by the ignition coil to the subsequently arranged spark plug. Very good results were achieved with cascade circuits of three to fifty phototransistors, photothyristors or photo-IC's connected in series. A cascade circuit in which the optoelectronic semiconductor elements and the assigned light-emitting elements are constructed in each instance as a hybrid circuit is particularly advantageous. A cascade circuit can be controlled with only one or also with two light-emitting elements. Accordingly, a uniform distribution of the light of a light-emitting element to a plurality of semiconductor elements is possible in a simple and inexpensive manner. At the same time, a safety advantage is provided for failure of an individual light-emitting element in that the cascade blocks when the LED's are connected one after the other.

A higher luminosity factor is possible in the particularly advantageous development of the invention with a glass rod. High operational temperatures are possible even with relatively low current of the light-emitting elements. At the same time, the light-emitting elements and the semiconductor elements are well insulated relative to one another.

When the light is distributed by means of individual fibers of a light guide, a virtually optimum galvanic decoupling is possible between the high-voltage potential of the ignition distributor and the driving potential of the semiconductor elements, particularly when the light-emitting elements are spatially separated from the distributor in an ignition switching device. Resistance to interference is accordingly improved. The light distribution in the high-voltage opto-switch is also simplified.

The light-emitting elements are preferably constructed as low-voltage elements and are e.g. actuable as light-emitting diodes with control voltages of less than 5 volts.

A cascade circuit with three to fifty high-voltage transistors, thyristors or IC's can be used for connecting through high voltages, such as those occurring e.g. as ignition voltages in automotive engineering.

BRIEF DESCRIPTION OF THE DRAWING

Embodiment examples of the invention are shown in the drawing and explained in more detail in the following description.

DESCRIPTION OF THE PREFERRED EMBODIMENTS

Figure 1:
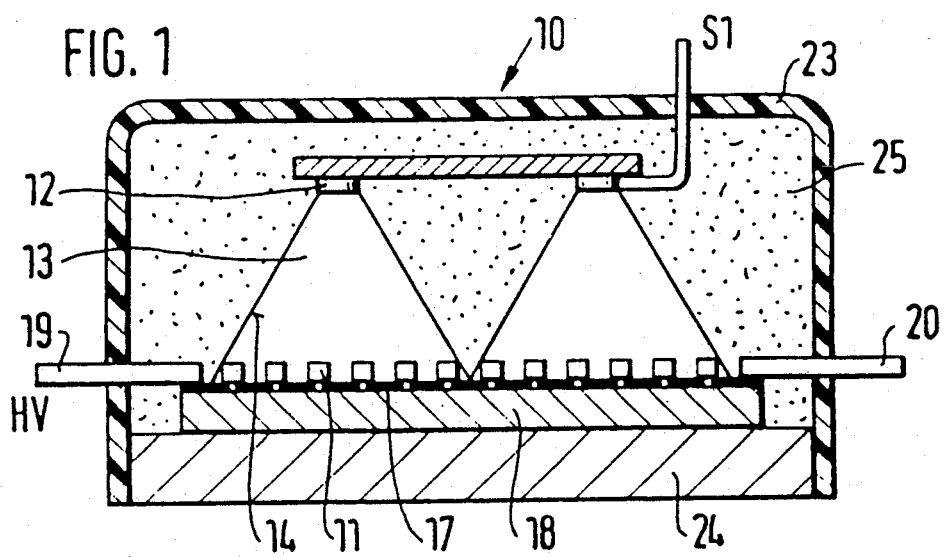
FIG. 1 shows a section through a high-voltage switch constructed using hybrid technology.

In FIG. 1, a high-voltage switch 10 comprises a cascade circuit constructed using hybrid technology and comprising a plurality of optoelectronic semiconductor elements 11. In this example, the semiconductor elements 11 are constructed as photothyristors. Light-emitting diodes (LEDs) 12, are arranged at a slight distance opposite to groups of six semiconductor elements 11 in each instance. The radiation of the light-emitting diodes 12 advantageously lies in the infrared range. Wells 13 with walls 14 which are white on the inside are formed between the diodes 12 and the respective groups of semiconductor elements 11, the wells 13 being trapezoidal in cross section. The wells 13 have approximately the width of the semiconductor elements 11. The walls of the wells 13 are white on the inside in order to enable a diffuse reflection of the light radiated from the diodes 12 and accordingly a uniform light distribution to all semiconductor elements 11 in a group comprised by the well 13. The wells 13 can be filled with light-permeable materials such as glass for insulation. The semiconductor elements 11 are interconnected via conductor paths 17 and resistance networks and are arranged above a carrier substrate 18 comprising $Al_2O_3$. The conductor paths 17 are electrically connected with high-voltage connection lugs 19, 20. The high-voltage connection lug 19 serves as high-voltage (HV) connection to the ignition coil and the other high-voltage connection lug 20 serves as a connection leading to a spark plug. Depending on the quantity of cylinders (i.e. spark plugs), other such high-voltage switches 10 are connected in parallel at the connection 19.

The control connection S1 of the light-emitting diodes 12 loads out at the top of the housing 23 of the high-voltage switch 10. The housing 23 comprises plastic and is closed at the bottom by an aluminum cover 24. The interior of the housing 23 is sealed with a sealing compound 25 so that optimal insulation is achieved.

Figure 2A:
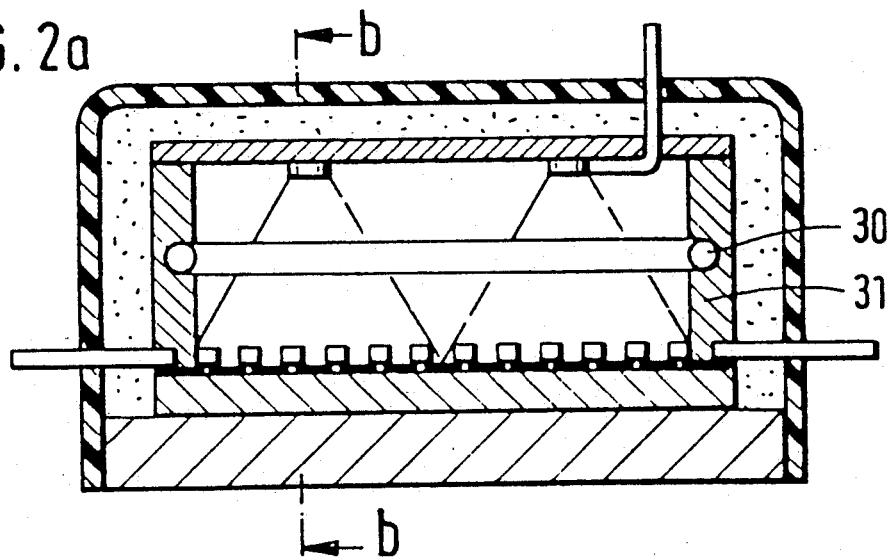
FIG. 2a shows a switch second embodiment example.
Figure 2B:
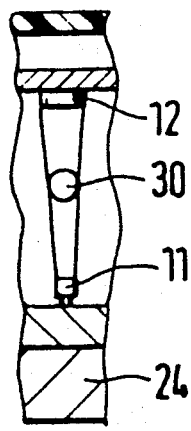
FIG. 2b shows a section through FIG. 2a in direction II.

In the embodiment according to FIG. 2, the same structural component parts are designated by the same numbers. Instead of the wells 13, a glass rod 30, e.g. of transparent plastic, is arranged in a holder 31 between the diodes 12 and the semiconductor elements 11, which glass rod 30 acts as a cylinder lens. The light radiated by the diodes 12 is focussed by the glass rod 30 on the semiconductor elements 11 arranged in a line. Again, a plurality of semiconductor elements 11 can be controlled by the light of a single diode 12. The luminosity factor is higher than in the construction according to FIG. 1 with wells 13. Accordingly, it is possible to drive the diodes 12 with a relatively low current and to operate at a relatively higher temperature. FIG. 2b shows the path of rays of the light emitted by a diode 12.

Figure 2C:
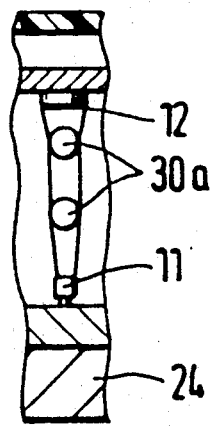
FIG. 2c shows a modification of the embodiment example according to FIG. 2b.

A modification in which a plurality of glass rods 30a are arranged one below the other between the diodes 12 and the semiconductor elements 11 is shown in the construction according to FIG. 2c.

Figure 3:
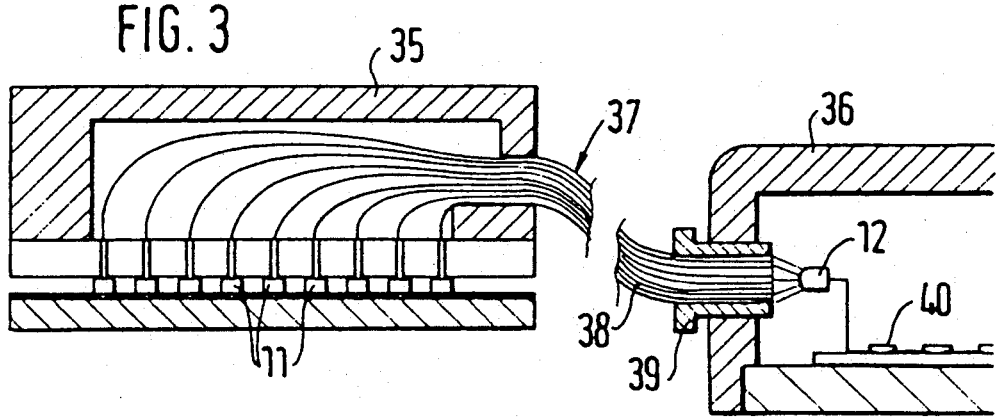
FIG. 3 shows a third embodiment example.

The construction according to FIG. 3 shows an arrangement of the diodes 12 and the semiconductor elements 11 in two separate housings 35, 36 and a transmission of the radiation by means of a fiber-optic light guide 37. The light guide 37 comprises a bundle of individual fibers 38, as is known. The radiation of a diode 12 is fed into the light guide 37 and, its fibers 38 are guided in each instance to a semiconductor element 11. A light guide 37 and a diode 12 are provided for every cylinder. It is also conceivable to combine the light guides 37 to form an a cable. By using the light guide 37, a safe electrical decoupling between the high-voltage potential and the driving potential is made possible. The susceptibility to interference is improved and the light distribution to the individual semiconductor elements 11 is simplified. The light guide 37 can be plugged into the housing 36 of the switching device in the area of the diode 12 by means of a plug-in light guide connection 39. The diode 12 is connected with a circuit 40 for the transistor-coil ignition, which circuit 40 is constructed using hybrid technology.

Figure 4:
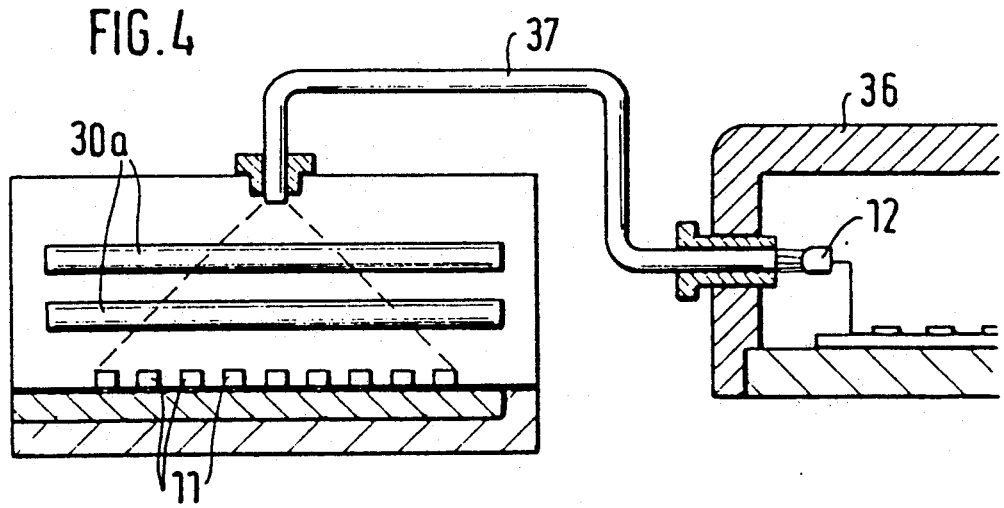
FIGS. 4 and 5 show additional embodiment examples in a sectional view.
Figure 5:
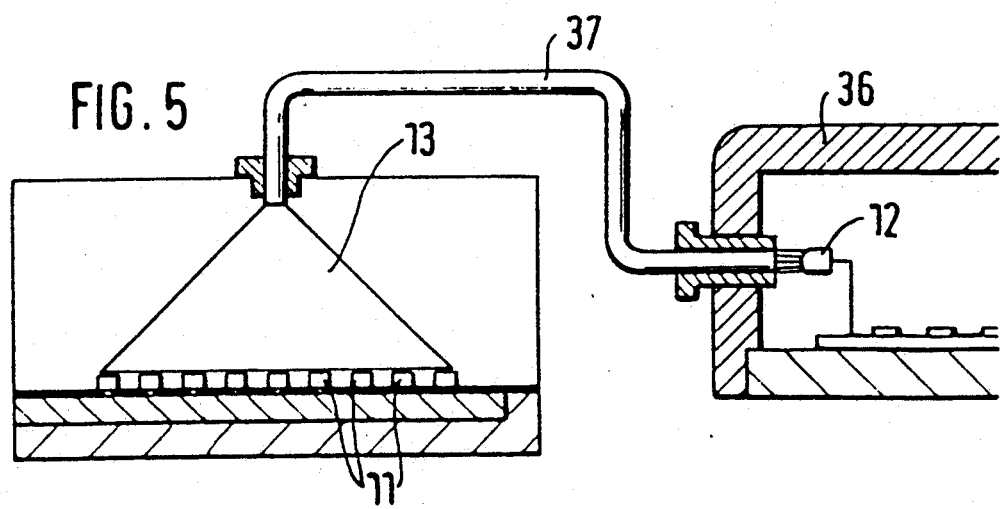

The constructions according to FIGS. 4 and 5 likewise show an arrangement of light-emitting diodes (LED's) 12 and semiconductor components 11 in separate housings; in so doing, the diodes 12 (LED's) are advantageously arranged in the housing 36 of the switching device of an ignition system. The light of the diodes 12 is either focussed on the photo-semiconductor components 11 by means of the light guides 37 with glass rods 30 acting as cylinder lenses, as shown in FIG. 4, or is directed to the photo-semiconductor components 11 by means of the light diffusing well 13 as shown in FIG. 5.

Figure 6:
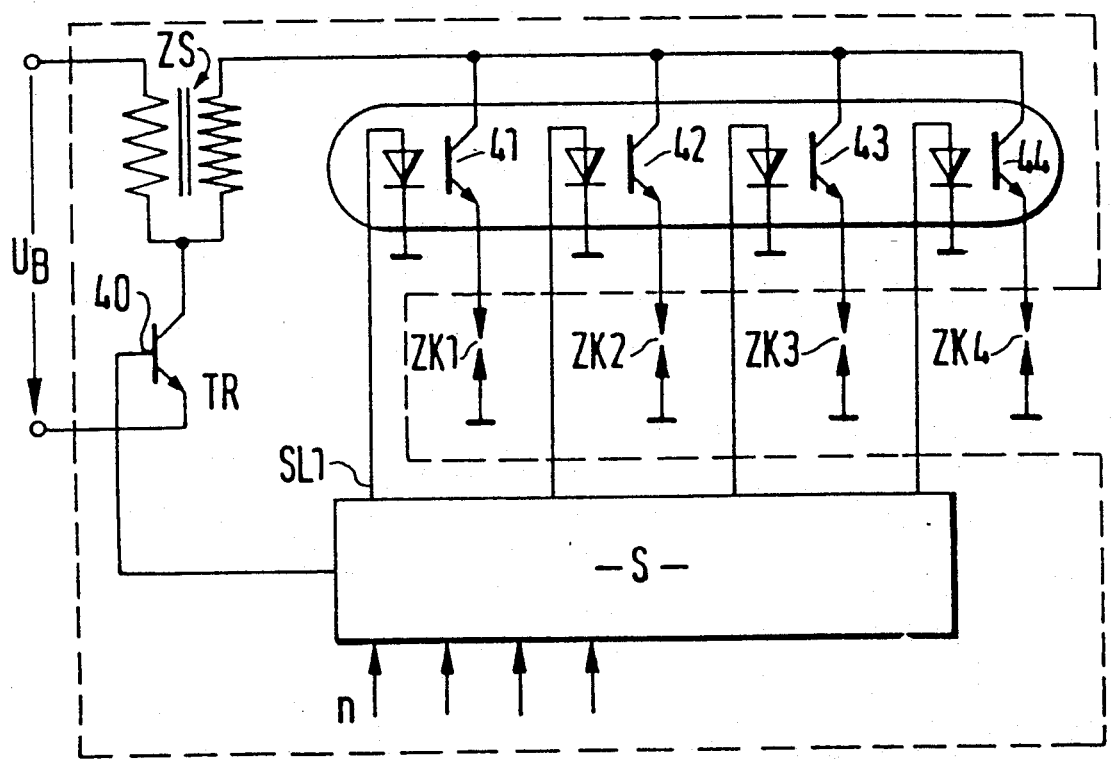
FIG. 6 shows an ignition system with high-voltage switch.

A circuit arrangement for the distribution of the ignition voltage is indicated in FIG. 6, wherein each of the cascade circuits 41 to 44 is shown here in a simplified manner by means of a photo transistor element. The individual cascade circuits include the groups of semiconductor elements 11 shown in FIGS. 1 to 5.

A battery voltage UB is applied to the primary winding of the ignition coil ZS, via an ignition transistor TR whose collector is connected between the primary and secondary winding. The ignition transistor TR is actuated by pulses applied to its base contact 40 from a control S, thus generating a high voltage on the secondary winding of the ignition coil ZS. The secondary winding of the ignition coil ZS is grounded via the cascade circuits 41—44 and the spark plugs ZK1—ZK4.

The control S determines the respective optimal ignition time for the cylinders of the motor vehicle or spark plugs ZK1 to ZK4 as a function of the engine speed n and other parameters characterizing the respective operating state of the internal combustion engine. If, for example, spark plug ZK1 is to fire on the basis of this ignition time calculation, the control S causes the ignition transistor TR to be switched off and a high-voltage pulse is accordingly produced on the secondary winding of the ignition coil ZS, at the same time, the control S causes a control signal to be transmitted in its control line SL1 to activate the light-emitting diode of the cascade circuit 41. The light-emitting diode accordingly turns on the cascade circuit 41, so that the ignition voltage arrives at the spark plug ZK1. The rest of the spark plugs ZK2 to ZK4 are acted upon according to the calculated ignition times in a corresponding manner.

The possibilities of using the high-voltage switch described in a plurality of embodiment examples are not limited to use in ignition systems of internal combustion engines. The use of an optoelectronically coupled high-voltage switch can be advantageous wherever a galvanic separation between the electric circuit and the high-voltage circuit is desired or necessary.

We claim:

1. High-voltage switch, particularly for use as ignition voltage distributor for applying the ignition voltage to spark plugs of an internal combustion engine, comprising a plurality of optoelectronic semiconductor elements connected to a high voltage; at least one light-emitting element provided per each of said spark plugs, every light-emitting element being in a working connection with a plurality of said semiconductor elements; and at least one biconvex cylinder lens arranged between at least one of said light-emitting elements and said semiconductor elements.

2. High-voltage switch according to claim 1, characterized in that the lens (30) is a glass rod.

3. High-voltage switch according to claim 1, characterized in that the lens (30) comprises a radiation permeable plastic.

4. High-voltage switch according to claim 1, characterized in that the radiation of said at least one element (12) is fed via light guide fibers (38) to a plurality of semiconductor elements (11).

5. High-voltage switch according to claim 4 characterized in that said at least one element (12) is located in a switching device of a transistor ignition which is arranged so as to be separate from the high-voltage switch, and in that the radiation of the element (12) is transmitted by means of a light guide (37).

6. High-voltage switch according to claim 1, characterized in that the semiconductor elements are constructed as at least one of high-voltage phototransistors, photothyristors and photo-IC's.

7. High-voltage switch according to claim 1, characterized in that the light-emitting elements (12) are light-emitting diodes (LED's).

8. High-voltage switch according to claim 1, characterized in that the radiation of the light-emitting elements (12) lies in the infrared range.

9. High-voltage switch according to claim 1, characterized in that the light-emitting elements (12) work with low voltage.

10. High-voltage switch according to claim 1, characterized in that a cascade circuit (41 to 44) with respective light-emitting elements (12) is assigned to every spark plug (ZK1 to ZK4) of an internal combustion engine.

11. High-voltage switch according to claim 10, characterized in that the cascade circuits of the optoelectronic semiconductor elements (11) and the assigned light-emitting elements (12) are constructed as a hybrid circuit in which a light permeable insulator (15) is arranged between the optoelectronic semiconductor elements (11) and the adjacent light-emitting elements (12).

* * * * *